United States Patent

[11] 3,620,794

[72] Inventor Carlos G. Figueroa
Columbus, Ohio
[21] Appl. No. 650,226
[22] Filed June 30, 1967
[45] Patented Nov. 16, 1971
[73] Assignee Industrial Nucleonics Corporation

[54] METHOD OF FORMING A PATTERNED RADIATION SOURCE
10 Claims, No Drawings

[52] U.S. Cl. ........................................ 117/5.5, 117/106, 117/212, 117/220, 250/106
[51] Int. Cl. ........................................ G21h 1/00
[50] Field of Search ........................................ 117/212, 220, 5.5, 106; 252/301.1; 250/83.6, 106 S, 84, 84.5

[56] References Cited

UNITED STATES PATENTS

| | | | |
|---|---|---|---|
| 3,326,178 | 6/1967 | DeAngeles | 117/220 X |
| 3,230,374 | 1/1966 | Jones et al. | 250/84 X |
| 3,102,038 | 8/1963 | Fisher, Jr. | 117/127 X |
| 2,711,484 | 6/1955 | Knapp, Jr. | 250/83.6 |

*Primary Examiner*—Alfred C. Leavitt
*Assistant Examiner*—A. M. Grimaldi
*Attorneys*—Marechal, Biebel, French & Bugg, William T. Fryer, III, C. Henry Peterson and James J. O'Reilly

ABSTRACT: Precisely patterned radiation sources are formed by exposing a base member to an inert gas radioisotope (krypton-85) at an elevated temperature and pressure to cause interstitial penetration of the atoms of the radioisotope into the lattice of the base material as controlled by a pattern formed on the surface of the base. Another procedure involved uniformly diffusing the atoms of the inert gas radioisotope into the lattice of a base material and subsequently etching portions of the surface to provide a precisely patterned radiation source.

METHOD OF FORMING A PATTERNED RADIATION SOURCE

1. Field of Invention

This invention relates to methods for making precisely patterned radiation sources and more particularly to improved methods by which an inert gas radioisotope is forced into the lattice of a base material in an accurate and precise predetermined configuration and retained interstitially therein.

2. Description of the Prior Art

In U.S. Pat. No. 2,711,484 a process is described in which radium D (radioactive lead isotope of 22 years half life) is diffused into a base which contains lead by the following procedure. A stop-off or mask material is applied to the lead containing base except on those areas which are to be rendered radioactive. Thereafter, the base is electroplated in a lead fluoroborate bath in which some of the lead is the radium D isotope. The plated part is then heated in a furnace to diffuse the radioisotope into the base. After diffusion, the part is dipped or treated in a cleaning solution to remove the electrodeposited lead.

The above described procedure has several disadvantages including the fact that the radioisotope used must be of the same species as the base, e.g., radium D with a lead containing base. Also, due to the electroplating operation, the procedure is not useable with nonconductors unless they are pretreated to provide a conductive surface upon which the lead compound may be plated. The pretreating operation, in effect, interposes a barrier between the base and the electroplated radioisotope containing lead material thus seriously affecting the subsequent diffusion operation. When the procedure above described is used to form a pattern of predetermined configuration, one of the drawbacks is the fact that the radioisotope, being of the same species as the host material, tends to replace like atoms in the crystal structure either during the diffusion or sometime thereafter. The diffusion is in all directions including laterally so that the pattern, if formed, is not well defined. Thus, the resultant product does not possess well defined boundary areas needed for accurate measurements such as for use in tachometers, gyroscope pick-offs, accelerometers and the like.

Technical Background

Krypton–85 is an inert gas radioisotope having a half life of 10.6 years and which emits beta radiation (670 kev.) and gamma (517 kev.) in the approximate ratio of 4.6 gammas for each 1000 betas. The atomic diameter of krypton–85 is relatively small, e.g., 3 to 4 A. units and thus the atoms of krypton–85 are able to penetrate and be retained interstitially in the lattice of a host material without adversely affecting its crystal structure.

Virtually any material may be kryptonated (that is, be processed to introduce the radioisotope interstitially within the lattice) to varying activities depending on the host material used. Incorporation of krypton–85 into all surfaces of a host material has been carried out by several methods. In one method, krypton–85 atoms are ionized and drawn to the host material by applying a potential drop across the ion generating source and the host material. In a second method, all surfaces of the host material are impregnated by diffusing the atoms of krypton–85 into the host by use of high pressure and temperature. A specific procedure for kryptonating solids under pressure and temperature conditions is disclosed in copending application Ser. No. 609,226, filed Jan. 13, 1967, now Pat. No. 3,493,319 and assigned to this assignee.

Summary of the Invention

Accordingly, it is a primary object of the present invention to provide an improved and relatively simple process of forming precisely patterned radioactive sources utilizing an inert gas radioisotope, wherein the process may be used for both conductive and nonconductive base material.

Another object of the present invention is to provide an improved process for the production of precisely patterned sources wherein an inert gas radioisotope (kryton–85) is diffused inteastitially into the lattice of a host material under conditions of elevated temperature and pressure and wherein the lattice structure of the host material is not adversely affected.

These and other objects of the present invention have been accomplished in accordance with the present invention by a process in which the host material is processed to provide a pattern of predetermined precise configuration which is defined by portions of the base member which are differentially emissive. The differentially emissive areas of the base or host members are characterized by different absorption characteristics. The base member is exposed to an inert gas radioisotope such as krypton–85 under conditions of elevated temperature and pressure for a period of time sufficient to cause interstitial penetration of the atoms of the gas into the lattice of the host material. The atoms are differentially absorbed depending upon the absorption coefficient of the respective areas.

In one procedure, a base member including surface portions having different absorption characteristics which form a predetermined pattern is kryptonated under conditions of elevated temperature and pressure so that the resultant product includes areas of greater and lesser specific activity, i.e., primary and secondary emissive areas.

In another procedure, a stop-off material is applied to a base in a predetermined pattern, the base is then kryptonated, as described and the stop-off material removed to provide a product which includes emissive and nonemissive areas.

A variation of these procedures includes uniformly kryptonating a base material, applying a stop etch material in a pattern and thereafter etching the nonprotected portions to form a patterned source.

Description of the Invention

In accordance with the present invention, various bases may be treated under conditions of elevated temperature and pressure to cause the atoms of the inert gas radioisotope krypton–85 to penetrate interstitially into the lattice of the base or host material. For example, the following materials may be treated to provide the following specific activities:

| | microcuries/cm.$^3$ |
|---|---|
| Aluminum | 20 |
| Pyrolytic graphite | 4.5 |
| Copper | 130 |
| Gold | 5×10'7E'3 |
| Magnesium | 3 |
| Nickel | 10'7E'3 |
| Tin | 8×10'7E'3 |
| Zinc | 3×'7E'1 |

In addition to the above, materials such as steel and waspalloy Hastalloy X, Inconel 713C, have been treated to comparatively high specific activities with krypton–85. By use of a relatively high pressures and temperatures, e.g., ambient temperature to several hundred degrees centigrade and several thousand pounds per square inch, the depth of penetration has varied from 500 A. to 2000A. The time of exposure to elevated temperature and pressure may vary from 1 hour to several depending on the host material. Apparatus for carrying out this process is disclosed in application Ser. No. 609,226, now Pat. No. 3,493,319 supra and reference is made thereto.

In addition to the above materials, nonconductors as aluminum oxide, asbestos, phenolic resin, magnesium dioxide, zirconium, attapulgite clay, and the like may also be treated, but in the case of plastics (e.g. phenolic resin) the temperature should be less than the decomposition temperature of the plastic.

To form a patterned source in accordance with the present invention a base or host material is provided which includes surface areas with different absorption characteristics. Such a base may be prepared by forming surface portions of dissimilar materials in a predetermined pattern, e.g. aluminum and copper or copper and gold. Since these material have different absorption characteristics, they form primary and secondary emissive areas. The base with the surface pattern thereon is then treated at elevated temperature and pressure in an atmosphere of krypton–85 gas for a period of time sufficient to cause interstitial penetration of the atoms of the radioisotope into the surface of the base. Due to the difference in absorption, the copper portions will retain a greater amount of krypton–85 and form the primary emissive areas, while the gold and aluminum are the secondary emissive areas. The pattern formed by the dissimilar materials may be of any geometric configuration or any predetermined configuration.

A simpler technique involves pretreating a base to form patterns thereon of predetermined configuration by application to the base of a "stop-off" material which, after exposure to elevated temperature and pressure, is thereafter removed. The stop-off material is applied in the areas which are to be nonemissive and operates to provide protective areas preventing absorption of the krypton–85 atoms by those portions of the base underlying the protective areas. The nonprotected areas of the base constitute the intended emissive portions of the base. After application of the stop-off material the base is kryptonated as previously described and the stop-off material is thereafter removed. Typical of the stop-off materials which may be used are sodium silicate water soluble inorganic binders which cure to a hard but water soluble coating. These coatings may be stripped by flushing or dipping the kryptonated part in warm water, and being inorganic in nature they offer the advantage of being capable of exposure to relatively high temperature without being destroyed. One such material is described in U.S. Pat. No. 3,102,038. Another suitable material is a group of organic binders which are soluble in aqueous alkali but insoluble in water, for example vinyl acetate-crotonic acid copolymers (Gelva C5 V10). These may be dissolved in a water ammonium hydroxide solution and after the ammonia evaporates, a water insoluble coating is left which may be removed by rinsing with an aqueous alkali solution. Also useable are materials such as varnish, shellac and alkyd resins which may be removed by solvents such as alcohol or methyl ethyl ketone. If desired, pigments may be added to the various above listed stop-off materials, and it is preferred to use materials such as aluminum, carbon, zinc, etc. It is of course understood that the temperature used during the pressure temperature absorption process should not exceed the temperature at which the binder will decompose.

The procedure described immediately above offers and advantage over the first procedure described in that the finished kryptonated part presents a continuous surface free of joints. The pattern is not visible to the eye but can be established quite easily by a radiation detector. It also has the advantage of providing a kryptonated precisely patterned part whose mass is essentially identical to the starting weight of the host material. This latter factor is of importance in cases such as gyroscopes, accelerometers or tachometers which may be fabricated and precision balanced and thereafter kryptonated, even with nonsymmetrical patterns without adversely affecting the balance.

In instances in which it is desired to provide primary and secondary emissive areas while maintaining continuous surface characteristics of the immediately preceding example, the host material is first selectively coated with a concentrating material such as heavy grease or paraffin in accordance with the desired pattern. The areas of the base covered by the concentrating material collectively form the the primary emissive areas while the uncoated areas form the secondary emissive areas. During exposure to krypton–85 gas, as previously disclosed, the areas under the concentrating material are subjected to an increased concentration of krypton–85 relative to the uncoated areas. After kryptonation, the paraffin or grease is removed by using an inorganic solvent.

It is also possible in accordance with the present invention to form precisely patterned parts by an etching procedure. Since kryptonation results in penetration to a depth of between 500A. and 2000A., it is relatively easy to form patterned parts without removal of a considerable depth of material. In this procedure, the host is uniformly kryptonated and thereafter coated with a protective coating in the areas which are not to be etched thereby forming etch and nonetch areas. The part is then etched with material being removed from the nonprotected areas. The etching procedure may be any conventional procedure such as chemical milling or electrochemical or chemical etching. The nonetched areas therefore form the emissive areas of the base material.

The methods above described offer the primary advantage of accuracy of the pattern portion because the radioisotope is of a material different from the host material and is not as susceptible to diffusion laterally. Several of the above procedures are also useable with nonconductive materials or plastic materials, however, care should be taken with the latter to control the condition of interstitial penetration of the krypton–85 atoms so as to avoid physically damaging the base by excessive heat.

While the methods herein described constitute preferred embodiments of the invention, it is to be understood that the invention is not limited to these precise methods, and that changes may be made therein without departing from the scope of the invention which is defined in the appended claims.

What is claimed is:

The method of forming a radiation source composed of at least one radiation emissive area on a base member wherein said emissive area is in a pattern of predetermined configuration defined by portions of said base member which are differentially emissive of radiation, said method comprising the steps of providing a base member having portions corresponding to a predetermined pattern having different absorption characteristics than adjacent portions of the base to form primary and secondary emissive areas, and exposing said base member to an inert gas radioisotope under conditions of elevated temperature and pressure for a period of time sufficient to cause absorption of said gas into the base as a function of the differential absorption characteristics of said adjacent portions whereby primary and secondary emissive areas are formed.

2. The method as set forth in claim 1 wherein said secondary areas are substantially free of absorbed inert gas radioisotope.

3. The method as set forth in claim 1 wherein said inert gas 85. is krypton–85.

4. The method as set forth in claim 1 wherein said pattern is formed by portions of the surface of said base material which are of different metals, the metal constituting said primary areas having a greater absorbency of said radioisotope gas than the metal constituting said secondary areas.

5. The method as set forth in claim 1 wherein said pattern is formed by applying to said base in the portion thereof constituting said primary areas a coating of a material capable of concentrating said atoms of said inert gas radioisotope for diffusion into said primary area of said base, and wherein said material is removed after exposure to said base member and to said inert gas radioisotope to form a patterned source in which the primary area contains more absorbed inert gas radioisotope than said secondary area.

6. The method as set forth in claim 1 wherein said base member is exposed to krypton–85 radioisotope under elevated temperature and pressure for a period of time sufficient to effect penetration of krypton–85 atoms to a depth of between 500 A. units to 2000 A. units.

7. The method as set forth in claim 1 wherein said pattern is formed by applying to a base in the portion thereof constituting said secondary areas a coating of a material capable of preventing said inert gas radioisotope from penetrating into said base thus forming protective areas preventing absorption of said gas by the portions of said base underlying said protective areas, and wherein said material forming said protective areas is removed after exposure of said base member to said inert gas radioisotope to form a patterned source in which the primary radiation emissive areas are of a predetermined configuration and wherein said secondary radiation emissive areas are substantially free of absorbed inert gas radioisotope.

8. The method as set forth in claim 7 wherein said inert gas radioisotope is krypton–85.

9. The method as set forth in claim 7 wherein said base member is metal and wherein said inert gas radioisotope is krypton–85.

10 The method of forming a radiation source composed of at least one emissive area on a metallic base member wherein said emissive area is in a pattern of predetermined configuration defined by portions of said base member which are differentially emissive of radiation, said method comprising the steps of exposing said base member to an inert gas radioisotope under conditions of elevated temperature and pressure for a period of time sufficient to cause absorption of the atoms of said gas by the base forming on said surface patterns of predetermined configuration which define areas to be etched and nonetched areas by applying a nonetch material to the nonetch areas, and etching said base member whereby the nonetch areas constitute the portion of said base member having a greater concentration of absorbed inert gas radioisotope.

* * * * *